(12) United States Patent
Shimizu et al.

(10) Patent No.: US 10,111,348 B2
(45) Date of Patent: Oct. 23, 2018

(54) ELECTRONIC COMPONENT PACKAGE, ELECTRONIC COMPONENT SERIES, AND CARRIER TAPE (71) Applicant: Murata Manufacturing Co., Ltd., Nagaokakyo-shi, Kyoto-fu (JP)

(72) Inventors: Yasuhiro Shimizu, Nagaokakyo (JP); Kiyoyuki Nakagawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 615 days.

(21) Appl. No.: 14/516,624

(22) Filed: Oct. 17, 2014

(65) Prior Publication Data
US 2015/0114695 A1 Apr. 30, 2015

(30) Foreign Application Priority Data

Oct. 31, 2013 (JP) .................................. 2013-226639
Jul. 30, 2014 (JP) .................................. 2014-154956

(51) Int. Cl.
H05K 1/03 (2006.01)
H05K 5/02 (2006.01)
H05K 13/00 (2006.01)

(52) U.S. Cl.
CPC ....... H05K 5/0217 (2013.01); H05K 13/0084 (2013.01)

(58) Field of Classification Search
CPC .......................... H05K 13/0084; H05K 5/0217
USPC ......................................................... 174/255
See application file for complete search history.

(56) References Cited

U.S. PATENT DOCUMENTS 4,440,355 A * 4/1984 Mori .................. H05K 13/0417
156/701
5,960,961 A * 10/1999 Gutentag ........... H05K 13/0084
206/714
6,032,845 A * 3/2000 Piccone ................. B65H 20/22
198/832.1

(Continued)

FOREIGN PATENT DOCUMENTS

CN       2433214 Y    6/2001
JP       07-101460 A  4/1995

(Continued)

OTHER PUBLICATIONS

Official Communication issued in corresponding Chinese Patent Application No. 201410588749.2, dated Jul. 20, 2016.

(Continued)

Primary Examiner — Timothy Thompson
Assistant Examiner — Rhadames J Alonzo Miller
(74) Attorney, Agent, or Firm — Keating & Bennett, LLP (57) ABSTRACT An electronic component package includes a carrier tape in which a plurality of substantially recess-shaped electronic component holding portions are provided in an elongated, narrow base material configured of a resin so that the electronic component holding portions include openings on one surface of the base material and bulge outward on the other surface of the base material, and a cover tape affixed to the one surface of the carrier tape so as to cover the openings in the respective electronic component holding portions. A thickness dimension of a base portion of the electronic component holding portion is smaller than a thickness dimension of the base material.

15 Claims, 6 Drawing Sheets

(56) References Cited

U.S. PATENT DOCUMENTS

| | | | | |
|---|---|---|---|---|
| 6,102,210 | A * | 8/2000 | Mikami | H05K 13/0417 206/714 |
| 6,398,034 | B1 * | 6/2002 | Takiar | B65D 73/02 206/486 |
| 7,573,722 | B2 * | 8/2009 | Tsai | H01R 43/0228 174/534 |
| 2006/0138019 | A1 * | 6/2006 | Yoshii | H05K 13/0084 206/714 |
| 2006/0157381 | A1 * | 7/2006 | Adams | H05K 13/0084 206/713 |
| 2006/0157382 | A1 * | 7/2006 | Yasufuku | H05K 13/0084 206/714 |
| 2008/0202981 | A1 * | 8/2008 | Hamanaka | H05K 13/0084 206/714 |
| 2009/0206000 | A1 * | 8/2009 | Bakar | H05K 13/0084 206/710 |
| 2012/0037538 | A1 * | 2/2012 | Tokoi | H05K 13/0084 206/714 |
| 2014/0166534 | A1 * | 6/2014 | Mori | H05K 13/0084 206/714 |

FOREIGN PATENT DOCUMENTS

| | | | |
|---|---|---|---|
| JP | 2000159265 A | * | 6/2000 |
| JP | 3160256 B2 | | 4/2001 |
| JP | 2002-068288 A | | 3/2002 |
| JP | 2006-272952 A | | 10/2006 |
| JP | 2006-273426 A | | 10/2006 |
| JP | 2006273426 A | * | 10/2006 |

OTHER PUBLICATIONS

Official Communication issued in corresponding Korean Patent Application No. 10-2014-0147287, dated Sep. 14, 2015.

Official Communication issued in corresponding Korean Patent Application No. 10-2014-0147287, dated Feb. 1, 2018.

Official Communication issued in Korean Patent Application No. 10-2014-0147287, dated May 18, 2018.

* cited by examiner

ELECTRONIC COMPONENT PACKAGE, ELECTRONIC COMPONENT SERIES, AND CARRIER TAPE

BACKGROUND OF THE INVENTION

1. Field of the Invention

The present invention relates to electronic component packages, electronic component series, and carrier tape.

2. Description of the Related Art

As an example of related art, Japanese Unexamined Patent Application Publication No. 2006-272952 discloses a configuration for carrier tape that contains electronic components. In Japanese Unexamined Patent Application Publication No. 2006-272952, an electronic component holding portion is provided in the carrier tape by press-molding a base material. The thickness of a base portion of the electronic component holding portion is substantially the same as the thickness of the base material.

With carrier tape that holds electronic components, a cover tape is affixed to the carrier tape and the carrier tape is then wound upon a reel. In the case where the thickness of the base portion of the electronic component holding portion is substantially the same as the thickness of the base material, as with the carrier tape according to Japanese Unexamined Patent Application Publication No. 2006-272952, the carrier tape will be approximately twice as thick as the base material. Because the carrier tape is wound upon the reel in many layers, thick carrier tape makes a larger-diameter reel necessary, which is undesirable.

SUMMARY OF THE INVENTION

Preferred embodiments of the present invention provide an electronic component package, an electronic component series, and carrier tape that reduce a thickness of a carrier tape and reduce a size of a reel.

An electronic component package according to a preferred embodiment of the present invention includes a carrier tape in which a plurality of recess-shaped or substantially recess-shaped electronic component holding portions are provided in a long, narrow base material made of a resin so that the electronic component holding portions include openings on one surface of the base material and bulge outward on the other surface of the base material, and a cover tape affixed to the one surface of the carrier tape so as to cover the openings in the respective electronic component holding portions. A thickness dimension of a base portion of each electronic component holding portion is smaller than a thickness dimension of the base material.

According to another aspect of various preferred embodiments of the present invention, the openings have rectangular or substantially rectangular shapes in which a lengthwise direction dimension when viewed from above is no greater than approximately 0.5 mm and a widthwise direction dimension when viewed from above is no greater than approximately 0.3 mm, and are arranged at equal or substantially equal intervals at a pitch of no greater than approximately 1.0 mm between adjacent openings, for example.

According to another aspect of various preferred embodiments of the present invention, a surface area of a base surface on the other surface of the base material in the base portion of each electronic component holding portion is greater than an area of the opening in each electronic component holding portion.

An electronic component series according to another aspect of various preferred embodiments of the present invention includes any one of the electronic component packages according to another preferred embodiment of the present invention, an electronic component held in a corresponding electronic component holding portion of the package, and a reel upon which the package is wound.

A carrier tape according to another aspect of various preferred embodiments of the present invention is a carrier tape in which a plurality of recess-shaped or substantially recess-shaped electronic component holding portions are provided in a long, narrow base material made of a resin so that the electronic component holding portions include openings on one surface of the base material and bulge outward on the other surface of the base material. In the carrier tape, a thickness dimension of a base portion of each electronic component holding portion is smaller than a thickness dimension of the base material.

According to various preferred embodiments of the present invention, a carrier tape is made thinner and the size of a reel is significantly reduced.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, an electronic component package, an electronic component series, and a carrier tape according to a preferred embodiment of the present invention will be described with reference to the drawings. In the following descriptions of the preferred embodiments, identical or corresponding elements will be given the same reference numerals and descriptions thereof will not be repeated.

Figure 1:
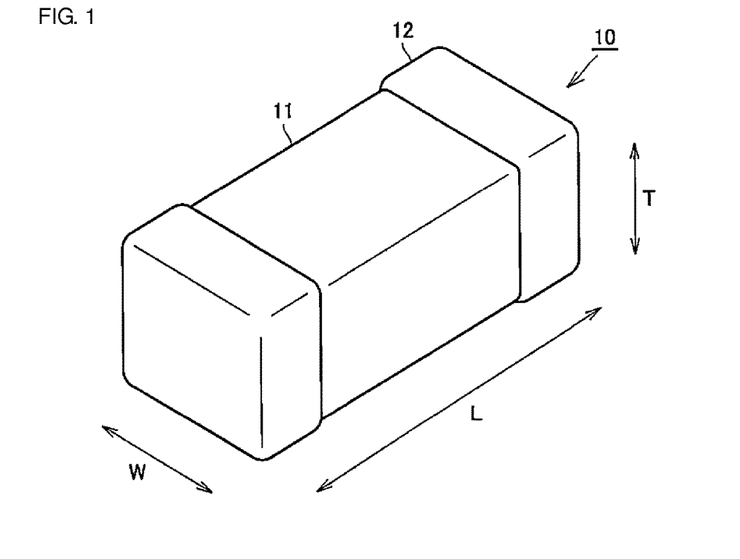
FIG. 1 is a perspective view illustrating the external appearance of a laminated ceramic capacitor.

First, a laminated ceramic capacitor, serving as an example of an electronic component, will be described. FIG. 1 is a perspective view illustrating the external appearance of a laminated ceramic capacitor. In FIG. 1, the lengthwise direction of an element housing is indicated by L, the width direction of the element housing is indicated by W, and the thickness direction of the element housing is indicated by T.

As illustrated in FIG. 1, a laminated ceramic capacitor 10 includes an element housing 11 having a rectangular or substantially rectangular outer shape and outer electrodes 12 provided on both end portions of the element housing 11. The element housing 11 is configured of a dielectric ceramic material, and an inner electrode (not shown) is embedded within the element housing 11.

The outer dimensions of the laminated ceramic capacitor 10 in the lengthwise direction L, the width direction W, and the thickness direction T preferably are about 0.4 mm×about 0.2 mm ×about 0.2 mm or about 0.2 mm×about 0.1 mm×about 0.1 mm, for example.

Figure 2:
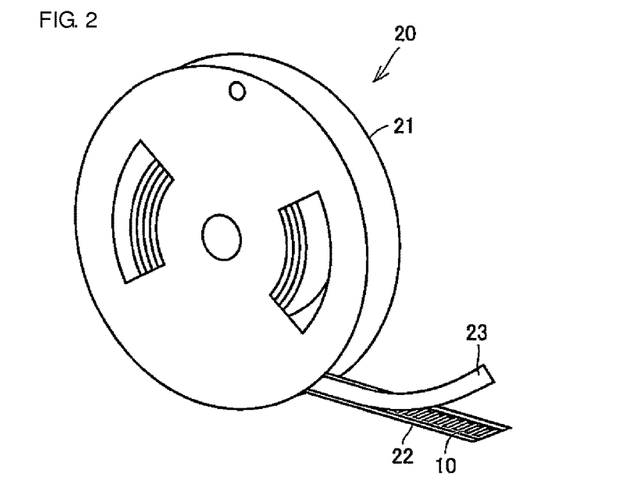
FIG. 2 is a perspective view illustrating the configuration of an electronic component series according to a preferred embodiment of the present invention.
Figure 3:
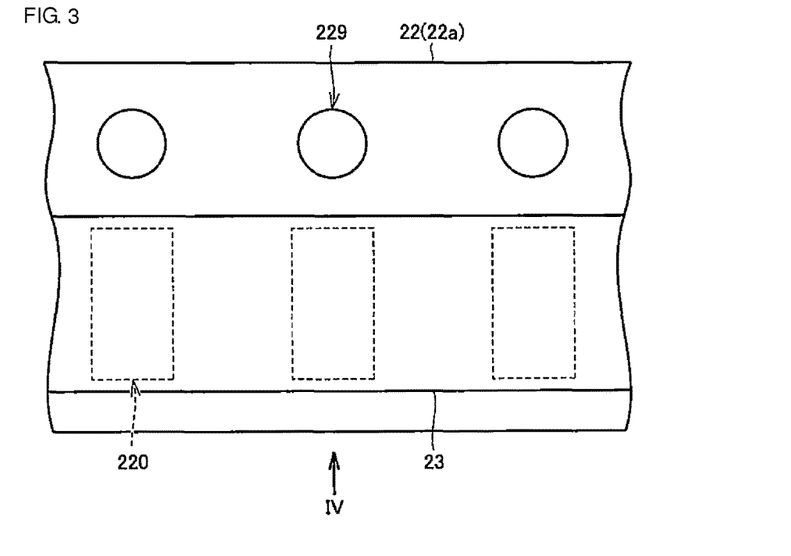
FIG. 3 is a plan view illustrating the external appearance of an electronic component package according to a preferred embodiment of the present invention.
Figure 4:
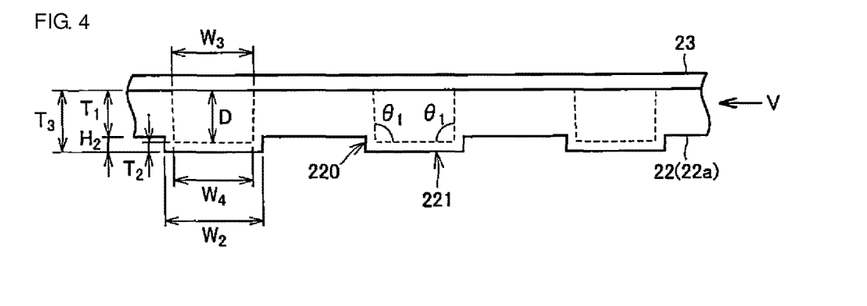
FIG. 4 is a diagram illustrating the electronic component package illustrated in FIG. 3 from the direction of an arrow IV.
Figure 5:
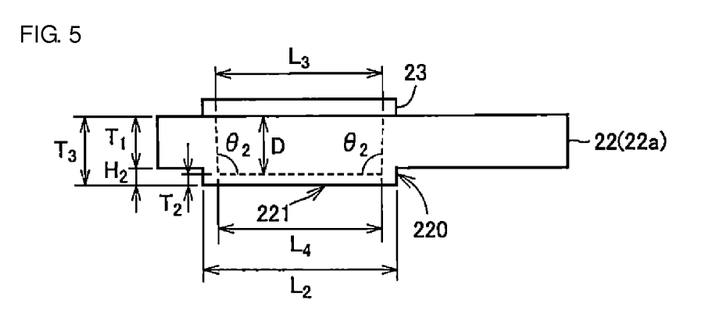
FIG. 5 is a diagram illustrating the electronic component package illustrated in FIG. 4 from the direction of an arrow V.

FIG. 2 is a perspective view illustrating the configuration of an electronic component series according to a preferred embodiment of the present invention. FIG. 3 is a plan view illustrating the external appearance of an electronic component package according to the present preferred embodiment. FIG. 4 is a diagram illustrating the electronic component package illustrated in FIG. 3 from the direction of an arrow IV. FIG. 5 is a diagram illustrating the electronic component package illustrated in FIG. 4 from the direction of an arrow V.

As illustrated in FIGS. 2 to 5, the electronic component package according to the present preferred embodiment of the present invention includes carrier tape 22 in which a plurality of recess-shaped or substantially recess-shaped electronic component holding portions 220 are provided in a long, narrow base material 22a configured of a resin so that the electronic component holding portions 220 include openings on one surface of the base material 22a and bulge outward on the other surface of the base material 22a. The electronic component package further includes cover tape 23 that is affixed to the one surface of the base material 22a of the carrier tape 22 so as to cover the electronic component holding portions 220.

As illustrated in FIG. 2, an electronic component series 20 according to the present preferred embodiment includes the electronic component package, electronic components held in corresponding electronic component holding portions 220 in the electronic component package, and a reel 21 upon which the electronic component package is wound.

The reel 21 is configured of a resin material, and includes a core portion having a through-hole in an axial center or substantially an axial center thereof and a pair of disk portions that extend radially from both end portions of the core portion in the axial direction thereof. In the reel 21, the electronic component package is wound upon the core portion between the two disk portions.

As illustrated in FIGS. 3 to 5, in the present preferred embodiment, the electronic component holding portions 220 are provided in the carrier tape 22 so as to be arranged in a single row at predetermined intervals in the lengthwise direction of the base material 22a. The electronic component holding portions 220 are disposed so as to be skewed toward one side of the base material 22a in the width direction thereof. A rectangular or substantially rectangular space is provided within each of the electronic component holding portions 220. The openings in the electronic component holding portions 220 are also rectangular or substantially rectangular when viewed from above.

Transport holes 229 are provided in the carrier tape 22 so as to be arranged in a single row at predetermined intervals in the lengthwise direction of the base material 22a. The transport holes 229 are disposed so as to be skewed toward the other side of the base material 22a in the width direction thereof. The transport holes 229 interlock with teeth in a sprocket that pulls the electronic component package out from the reel 21.

The cover tape 23 is affixed to one surface of the base material 22a of the carrier tape 22 so as to cover the electronic component holding portions 220. The cover tape 23 is disposed so as to be skewed toward one side of the base material 22a in the width direction thereof, so that the transport holes 229 are not covered.

The cover tape 23 may be formed of the same material as the carrier tape 22, but it is preferable for the cover tape 23 to be formed of a material whose electrical resistance is no greater than approximately $9.9 \times 10^{-11} \Omega$, for example. Forming the cover tape 23 of a material having a low electrical resistance makes it possible to prevent the cover tape 23 from being charged.

Although the cover tape 23 preferably has a band shape or substantially band shape in the present preferred embodiment, the cover tape 23 may have wave shapes that project so that, when the cover tape 23 is viewed from above, the waves are recessed following the transport holes 229 and enter into the spaces between adjacent transport holes 229, in order to increase the surface area across which the carrier tape 22 and the cover tape 23 adhere to each other.

Next, the shape of each electronic component holding portion 220 in the carrier tape 22 will be described in detail. As illustrated in FIGS. 4 and 5, a thickness dimension of the base material 22a is indicated by $T_1$. A depth dimension of the electronic component holding portion 220 is indicated by D. A thickness dimension of a base portion of the electronic component holding portion 220 is indicated by 12. In the present preferred embodiment, the relationship $D \geq T_1$ holds true, but the relationship may be $D < T_1$. In addition, the relationship $T_1 > T_2$ holds true. In other words, the thickness dimension of the base portion of the electronic component holding portion 220 is smaller than the thickness dimension of the base material 22a.

At an open end portion of the electronic component holding portion 220, a width dimension in the lengthwise direction of the base material 22a is indicated by $W_3$ and a length dimension in the width direction of the base material 22a is indicated by $L_3$. At an upper surface of the base portion of the electronic component holding portion 220, a width dimension in the lengthwise direction of the base material 22a is indicated by $W_4$ and a length dimension in the width direction of the base material 22a is indicated by $L_4$. In the present preferred embodiment, the relationships $W_3 \approx W_4$ and $L_3 \approx L_4$ hold true.

As will be described later, the base portion of the electronic component holding portion 220 preferably is formed by compressing the resin. As such, the resin that configures the base portion of the electronic component holding portion 220 has an increased density. This increases the strength of the base portion of the electronic component holding portion 220. Note that a through-hole may be provided in the base portion of the electronic component holding portion 220. In the case where a through-hole is provided in the base portion of the electronic component holding portion 220, the through-hole functions as an air passage hole when suctioning a top surface of the laminated ceramic capacitor 10 in order to remove the laminated ceramic capacitor 10 from the electronic component holding portion 220. This makes it possible to remove the laminated ceramic capacitor 10 from the base portion of the electronic component holding portion 220 with ease, making it easy to remove the laminated ceramic capacitor 10 as a result.

Of inner peripheral walls of the electronic component holding portion 220, an inner peripheral wall perpendicular or substantially perpendicular to the lengthwise direction of the base material 22a defines an angle $\theta_1$ with the upper surface of the base portion of the electronic component holding portion 220. Of inner peripheral walls of the electronic component holding portion 220, an inner peripheral wall perpendicular or substantially perpendicular to the width direction of the base material 22a defines an angle $\theta_2$ with the upper surface of the base portion of the electronic component holding portion 220. In the present preferred embodiment, the relationship $\theta_1 \approx \theta_2 \approx 90°$ holds true.

Furthermore, the relationship $\theta_1 > \theta_2$ generally holds true. Accordingly, the laminated ceramic capacitor 10 is prevented from being loose in the lengthwise direction L within the electronic component holding portion 220. As a result, when suctioning the upper surface of the laminated ceramic capacitor and removing the laminated ceramic capacitor 10 from the electronic component holding portion 220, the laminated ceramic capacitor 10 is able to be removed with a high level of positional precision in the lengthwise direction L.

With respect to the dimensions of a land to which the laminated ceramic capacitor 10 is mounted, a dimension in the length direction, which corresponds to the lengthwise direction L of the laminated ceramic capacitor 10, is generally greater than a dimension in the width direction, which corresponds to the width direction W of the laminated ceramic capacitor 10. Accordingly, when positioning the laminated ceramic capacitor 10 using the land as a reference, it is easy for the position to become skewed in the lengthwise direction L. Such positional skew can result in interference between components mounted earlier and a mounter nozzle, or can result in the laminated ceramic capacitor 10 sliding on solder during mounting. As such, with respect to the precision with which the laminated ceramic capacitor 10 is disposed during mounting, it is necessary for the laminated ceramic capacitor 10 to be disposed with a higher precision in the length direction of the land than in the width direction of the land. As described above, by ensuring that the relationship $\theta_1 > \theta_2$ holds true, the laminated ceramic capacitor 10 is removed from the electronic component holding portion 220 with a high level of positional precision in the lengthwise direction L, which makes it possible to dispose and mount the laminated ceramic capacitor 10 with a high level of precision in the lengthwise direction L.

The dimension of a bulge height, which corresponds to a distance between a base surface 221, on the other surface side of the base material 22a in a position corresponding to the base portion of the electronic component holding portion 220, and the other surface of the base material 22a, is indicated by $H_2$. At the base surface 221 of the electronic component holding portion 220, a width dimension in the lengthwise direction of the base material 22a is indicated by $W_2$ and a length dimension in the width direction of the base material 22a is indicated by $L_2$.

In the present preferred embodiment, the relationship $W_2 > W_3$ holds true. In addition, the relationship $L_2 > L_3$ holds true. Accordingly, the relationship $W_2 \times L_2 > W_3 \times L_3$ holds true. In other words, the surface area of the base surface 221 at the base portion of the electronic component holding portion 220 is greater than the surface area of the opening in the electronic component holding portion 220.

According to this configuration, when the electronic component package is wound upon the reel 21 so as to overlap as illustrated in FIG. 2, the base portion of the electronic component holding portion 220 located above is prevented from entering into the opening in the electronic component holding portion 220 located below.

The thickness dimension of the carrier tape 22 is indicated by $T_3$, and the relationship $T_3 = T_1 + H_2 = D + T_2$ holds true. As described above, the relationship $T_1 > T_2$ holds true, and thus $D > H_2$. In other words, the dimension of the bulge height of the electronic component holding portion 220 is smaller than the depth dimension of the electronic component holding portion 220. Meanwhile, it is preferable for the relationship $T_1 \leq 2T_2$ to hold true, and for the thickness dimension of the base material 22a to be no greater than approximately twice the thickness dimension of the base portion of the electronic component holding portion 220. According to this configuration, the carrier tape 22 is made thinner and the size of the reel 21 is reduced, while also securing space within the electronic component holding portions 220.

Furthermore, in the carrier tape 22, the relationship $T_1 > H_2$ holds true. As a result, a high connection strength between the base material 22a and the electronic component holding portions 220 is maintained. Note that in the case where the thickness dimension $T_1$ of the base material 22a is sufficiently great, the dimension $H_2$ of the bulge height of the electronic component holding portions 220 may be substantially 0.

In addition, in the electronic component holding portions 220, the relationships $W_3 \approx W_4$, $L_3 \approx L_4$, and $\theta_1 \approx \theta_2 \approx 90°$ hold true, and thus the positional precision instability at which the electronic components are stored is improved. As a result, the speed and precision of mounting operations to remove the electronic components from the package and mounting the electronic components are increased.

A non-limiting example of a manufacturing method for the carrier tape 22 according to the present preferred embodiment will be described next. Although the following descriptions of the manufacturing method are given from a cross-sectional view taken along the lengthwise direction of the base material 22a, the same applies assuming a cross-section taken along the width direction of the base material 22a.

Figure 6:
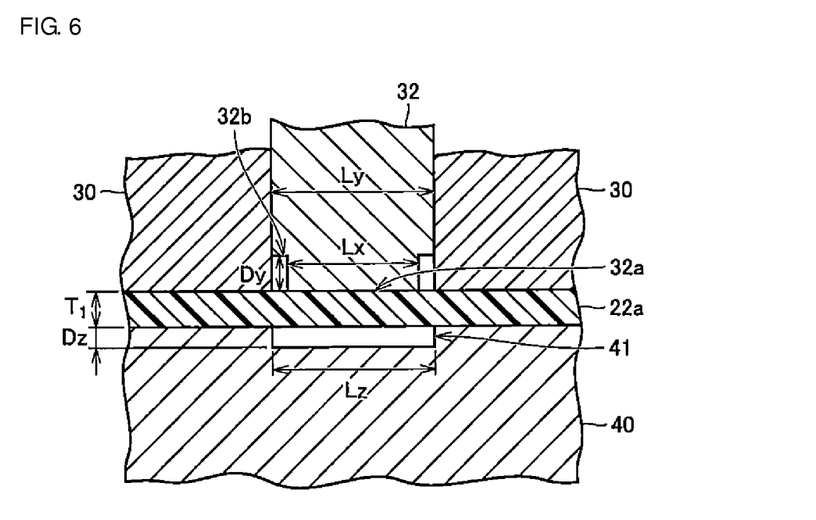
FIG. 6 is a cross-sectional view illustrating a base material being interposed and sandwiched between a first die plate and a stripper plate, in a method for manufacturing carrier tape according to a preferred embodiment of the present invention.
Figure 7:
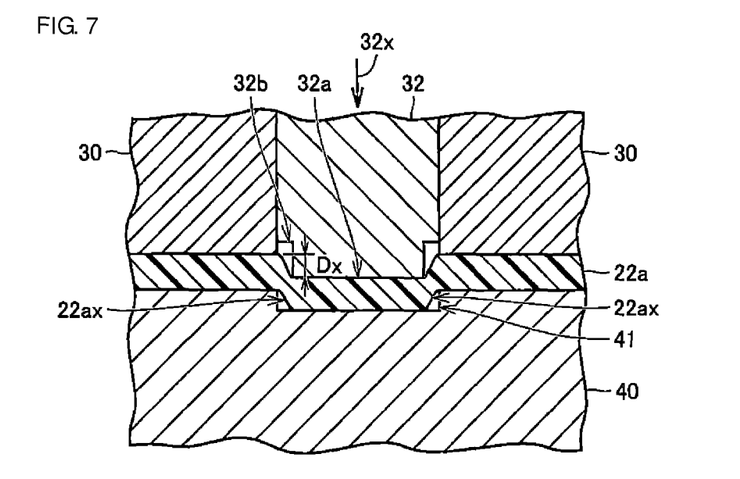
FIG. 7 is a cross-sectional view illustrating a portion of a base material extending into a groove in a first die plate under the leading end surface of a stepped pin, in a method for manufacturing carrier tape according to a preferred embodiment of the present invention.
Figure 8:
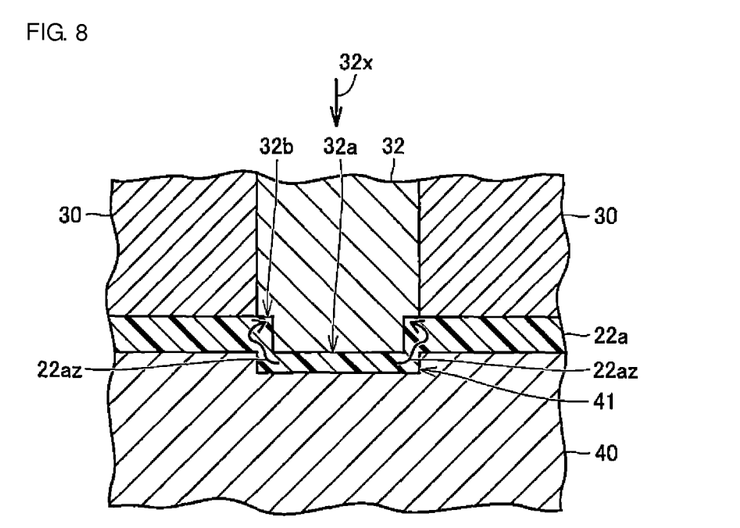
FIG. 8 is a cross-sectional view illustrating a base material being compressed between the leading end surface of a stepped pin and the base surface of a groove in a first die plate, in a method for manufacturing carrier tape according to a preferred embodiment of the present invention.

FIG. 6 is a cross-sectional view illustrating the base material being interposed and sandwiched between a first die plate and a stripper plate, in the method for manufacturing carrier tape according to the present preferred embodiment. FIG. 7 is a cross-sectional view illustrating a portion of the base material extending into a groove in the first die plate under the leading end surface of a stepped pin, in the method for manufacturing carrier tape according to the present preferred embodiment. FIG. 8 is a cross-sectional view illustrating the base material being compressed between the leading end surface of the stepped pin and the base surface of the groove in the first die plate, in the method for manufacturing carrier tape according to the present preferred embodiment.

As illustrated in FIGS. 6 to 8, in the method for manufacturing carrier tape according to the present preferred embodiment, the base material 22a is press-molded using a stepped pin 32 including a leading end surface 32a and a step portion 32b, a first die plate 40 including a groove 41 into which the leading end of the stepped pin 32 is inserted, and a stripper plate 30.

As illustrated in FIG. 6, the thickness dimension of the base material 22a is indicated by $T_1$. A depth dimension of the groove 41 in the first die plate 40 is indicated by Dz, whereas a width dimension of the groove 41 is indicated by Lz. A width dimension of the leading end side of the stepped pin 32 is indicated by Lx, a width dimension of the base side of the stepped pin 32 is indicated by Ly, and a height dimension of the step in the stepped pin 32 is indicated by Dy.

In the present preferred embodiment, the relationship $Dz<T_1$ holds true. In addition, the relationship $Dy \geq T_1$ holds true, but Dy may be less than $T_1$. Furthermore, the relationship $Ly \approx Lz > Lx$ holds true.

As illustrated in FIG. 7, when the stepped pin 32 descends as indicated by an arrow 32x, a portion of the base material 22a is pushed toward the interior of the groove 41 in the first die plate 40 by the leading end surface 32a of the stepped pin 32, and a tapered extended portion 22ax is formed as a result.

Note that FIG. 7 illustrates a state in which the dimension by which the base material 22a has been extended by the leading end surface 32a of the stepped pin 32 is Dx. Here, Dx=Dz. In this state, the base material 22a interposed between the leading end surface 32a of the stepped pin 32 and a base surface of the groove 41 in the first die plate 40 is not yet being compressed.

As illustrated in FIG. 8, when the stepped pin 32 descends further in the direction indicated by the arrow 32x, the base material 22a interposed between the leading end surface 32a of the stepped pin 32 and the base surface of the groove 41 in the first die plate 40 is compressed. The compressed base material 22a flows toward the extended portion 22ax as indicated by an arrow 22az, and fills the space between the step portion 32b of the stepped pin 32 and the groove 41 in the first die plate 40. Note that FIG. 8 illustrates a state in which the dimension by which the base material 22a has been extended by the leading end surface 32a of the stepped pin 32 is Dy.

By compressing the base material 22a while extending the base material 22a, the electronic component holding portion 220 can be formed having a recess shape that conforms to the outer shape of the stepped pin 32. In other words, the respective dimensions of the electronic component holding portion 220 fulfill the relationships $T_2=T_1+Dz-Dy$, $W_3 \approx W_4 = Lx$, and $W_2=Lz$.

Note that the press-molding of the base material 22a may be divided between two steps. That is, a step of extending the base material 22a and a step of compressing the base material 22a may be carried out individually.

A non-limiting example of a manufacturing method for the carrier tape 22 according to a variation of a preferred embodiment of the present invention, in which the press-molding is divided between two steps, will be described next. Although the following descriptions of the manufacturing method are given from a cross-sectional view taken along the lengthwise direction of the base material 22a, the same applies assuming a cross-section taken along the width direction of the base material 22a.

Figure 9:
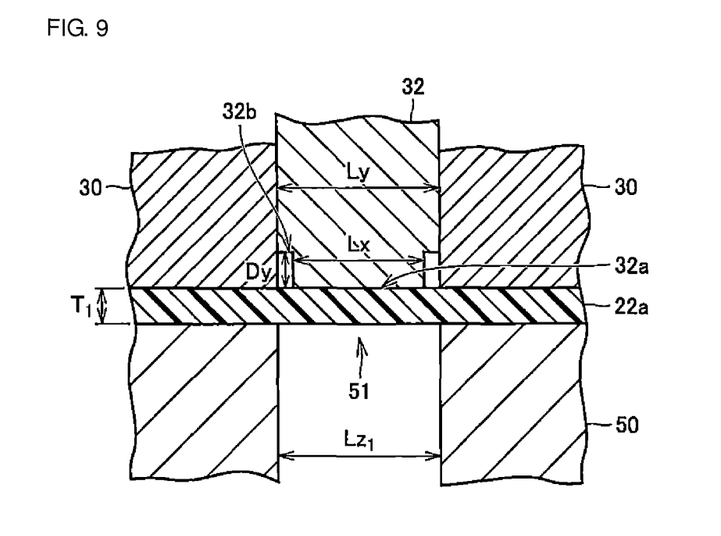
FIG. 9 is a cross-sectional view illustrating a base material being interposed and sandwiched between a second die plate and a stripper plate, in a method for manufacturing carrier tape according to a variation of a preferred embodiment of the present invention.
Figure 10:
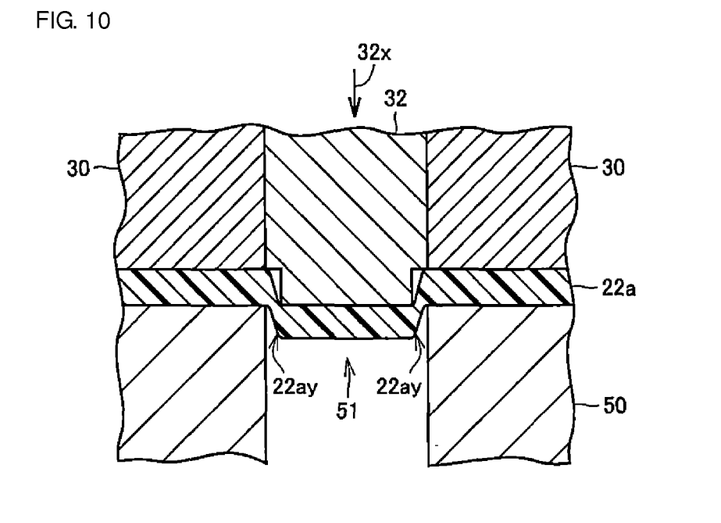
FIG. 10 is a cross-sectional view illustrating a portion of a base material extending into a groove in a second die plate under the leading end surface of a stepped pin, in a method for manufacturing carrier tape according to a variation of a preferred embodiment of the present invention.
Figure 11:
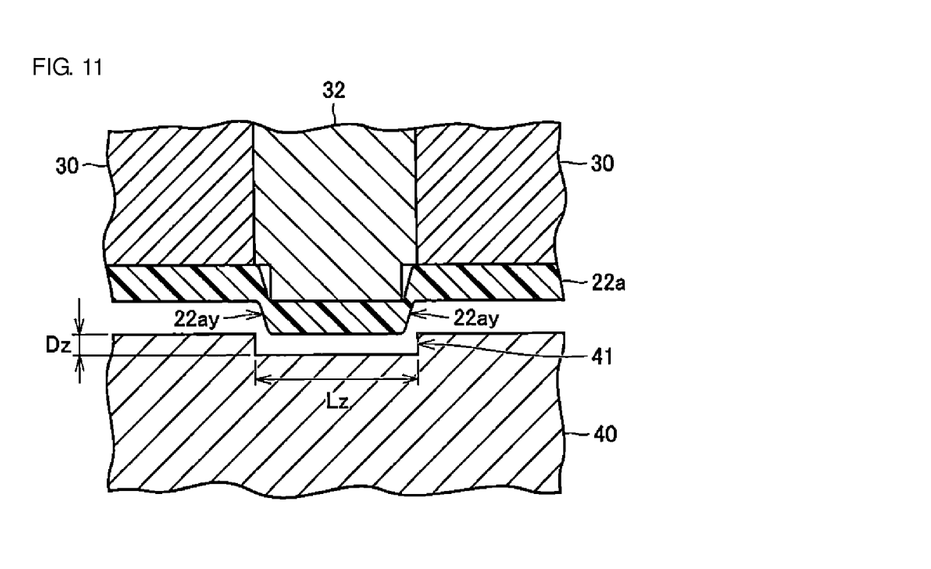
FIG. 11 is a cross-sectional view illustrating a first die plate disposed in place of a second die plate.
Figure 12:
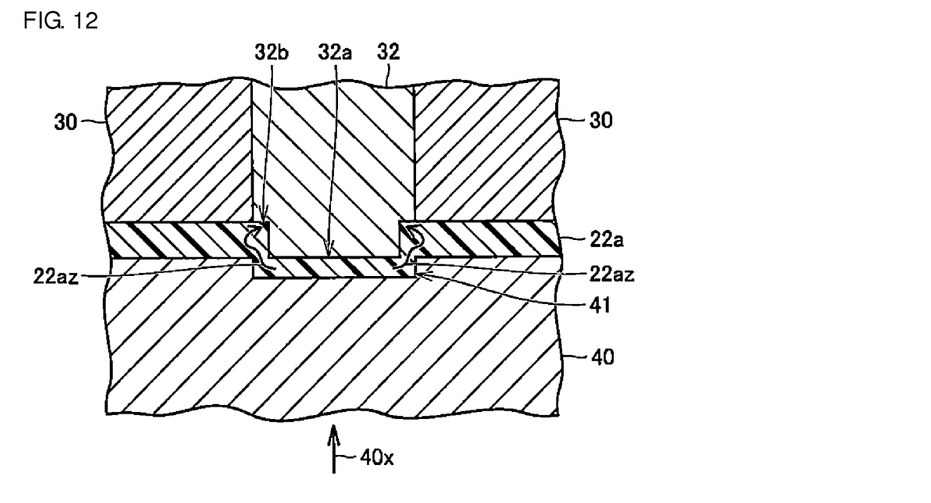
FIG. 12 is a cross-sectional view illustrating a base material being compressed between the leading end surface of a stepped pin and the base surface of a groove in a first die plate, in a method for manufacturing carrier tape according to a variation of a preferred embodiment of the present invention.

FIG. 9 is a cross-sectional view illustrating the base material being interposed and sandwiched between a second die plate and a stripper plate, in the method for manufacturing carrier tape according to the variation. FIG. 10 is a cross-sectional view illustrating a portion of the base material extending toward the interior of a hole in the second die plate under the leading end surface of the stepped pin, in the method for manufacturing carrier tape according to the variation. FIG. 11 is a cross-sectional view illustrating the first die plate disposed in place of the second die plate. FIG. 12 is a cross-sectional view illustrating the base material being compressed between the leading end surface of the stepped pin and the base surface of the groove in the first die plate, in the method for manufacturing carrier tape according to the variation.

As illustrated in FIGS. 9 to 12, in the method for manufacturing carrier tape according to the variation, the base material 22a is press-molded using the stepped pin 32 having the leading end surface 32a and the step portion 32b, the first die plate 40 including the groove 41 into which the leading end of the stepped pin 32 is inserted, a second die plate 50 including a hole 51 into which the leading end of the stepped pin 32 is inserted, and the stripper plate 30.

As illustrated in FIG. 9, the thickness dimension of the base material 22a is indicated by $T_1$. A width dimension of the hole 51 in the second die plate 50 is indicated by $Lz_1$. A width dimension of the leading end side of the stepped pin 32 is indicated by Lx, a width dimension of the base side of the stepped pin 32 is indicated by Ly, and a height dimension of the step in the stepped pin 32 is indicated by Dy. In addition, the relationship $Dy \geq T_1$ holds true, but Dy may be less than $T_1$. Furthermore, the relationship $Ly \approx Lz_1 > Lx$ holds true.

As illustrated in FIG. 10, when the stepped pin 32 descends as indicated by the arrow 32x, a portion of the base material 22a is pushed toward the interior of the hole 51 in the second die plate 50 by the leading end surface 32a of the stepped pin 32, and a tapered extended portion 22ay is formed as a result. Note that FIG. 10 illustrates a state in which the dimension by which the base material 22a has been extended by the leading end surface 32a of the stepped pin 32 is Dy.

In this variation, the compression step is carried out having replaced the second die plate 50 with the first die plate 40 after the aforementioned step of extension, as indicated in FIG. 11. The first die plate 40 according to this variation is the same as the first die plate 40 according to the aforementioned preferred embodiment, and includes the groove 41.

As illustrated in FIG. 12, when the first die plate 40 rises in the direction indicated by an arrow 40x, the base material 22a interposed between the leading end surface 32a of the stepped pin 32 and the base surface of the groove 41 in the first die plate 40 is compressed. The compressed base material 22a flows toward the extended portion 22ay as indicated by the arrow 22az, and fills the space between the step portion 32b of the stepped pin 32 and the groove 41 in the first die plate 40. Note that FIG. 12 indicates a state in which the dimension of the base material 22a compressed by the base surface of the groove 41 in the first die plate 40 is Dy−Dz.

In this manner, even in the case where the base material 22a is compressed after being extended, the electronic component holding portion 220 can be formed having a recess shape that conforms to the outer shape of the stepped pin 32.

Note that a thermoplastic resin, a thermosetting resin, or the like can be used as the material of the base material 22a. A conductive material may be added to the resin as well.

The base material 22a may be heated when the base material 22a is extended and compressed as described above. Specifically, a heater may be attached to at least one of the stepped pin 32, the first die plate 40, the second die plate 50, and the stripper plate 30.

Measuring the respective dimensions of each electronic component holding portion 220 in the carrier tape 22, manufactured according to the aforementioned manufacturing method, that holds the laminated ceramic capacitor 10 whose outer shape preferably is about 0.4 mm×about 0.2 mm×about 0.2 mm, resulted in the following measurements: $L_3$=about 0.49 mm; $L_4$=about 0.45 mm; $W_3$=about 0.29 mm; $W_4$=about 0.26 mm; and D=about 0.25 mm. Note that the measured values for each dimension are average values obtained from three laser scan measurements. Furthermore, $T_1$=about 0.24 mm, $T_2$=about 0.13 mm, and the pitch at which the openings of the electronic component holding portions 220 are formed is about 0.9 mm.

The preferred embodiments disclosed herein are to be understood in all ways as exemplary and in no ways limiting. The scope of the present invention is defined not by the aforementioned descriptions but by the scope of the appended claims, and all changes that fall within the same essential spirit as the scope of the claims are intended to be included therein as well.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component package comprising:
    a carrier tape in which a plurality of recess-shaped or substantially recess-shaped electronic component holding portions are provided in a base material made of a resin so that the electronic component holding portions include openings on one surface of the base material and bulge outward on the other surface of the base material; and
    a cover tape affixed to the one surface of the carrier tape so as to cover the openings in the respective electronic component holding portions; wherein
    a thickness dimension of a base portion of each of the electronic component holding portions is smaller than a thickness dimension of the base material;
    the thickness dimension of the base portion of the electronic component holding portions extends from a bottom surface of a corresponding opening in the respective electronic component holding portion to a base surface on the other surface of the base material in the base portion; and
    the thickness dimension of the base material is not greater than twice the thickness dimension of the base portion of the electronic component holding portions.

2. The electronic component package according to claim 1, wherein the openings have rectangular or substantially rectangular shapes in which a lengthwise direction dimension when viewed from above is no greater than 0.5 mm and a widthwise direction dimension when viewed from above is no greater than 0.3 mm, and are arranged at equal or substantially equal intervals at a pitch of no greater than 1.0 mm between adjacent openings.

3. The electronic component package according to claim 1, wherein a surface area of the base surface on the other surface of the base material in the base portion of each electronic component holding portion is greater than an area of the opening in each electronic component holding portion.

4. The electronic component package according to claim 1, wherein each of the electronic component holding portions is configured to hold a laminated ceramic capacitor.

5. The electronic component package according to claim 1, wherein the electronic component holding portions are skewed toward one side of the base material in a width direction thereof.

6. The electronic component package according to claim 5, wherein the carrier tape includes transport holes arranged to be skewed toward the other side of the base material in the width direction thereof.

7. The electronic component package according to claim 6, wherein the cover tape is skewed toward the one side of the base material in the width direction thereof so as not to cover the transport holes.

8. The electronic component package according to claim 1, wherein each of the electronic component holding portions includes a first inner peripheral wall perpendicular or substantially perpendicular to a lengthwise direction of the base material that defines a first angle with an upper surface of the base portion of the electronic component holding portion and a second inner peripheral wall perpendicular or substantially perpendicular to a width direction of the base material that defines a second angle with the upper surface of the base portion of the electronic component holding portion, and the first angle is greater than the second angle.

9. The electronic component package according to claim 1, wherein a bulge height of the electronic component holding portions bulging outward on the other surface of the base material is less than the thickness dimension of the base material.

10. An electronic component series comprising:
    the electronic component package according to claim 1;
    an electronic component held in a corresponding electronic component holding portion of the package; and
    a reel upon which the package is wound.

11. The electronic component series according to claim 10, wherein the openings have rectangular or substantially rectangular shapes in which a lengthwise direction dimension when viewed from above is no greater than 0.5 mm and a widthwise direction dimension when viewed from above is no greater than 0.3 mm, and are arranged at equal or substantially equal intervals at a pitch of no greater than 1.0 mm between adjacent openings.

12. The electronic component series according to claim 10, wherein a surface area of the base surface on the other surface of the base material in the base portion of each electronic component holding portion is greater than an area of the opening in each electronic component holding portion.

13. The electronic component series according to claim 10, wherein the electronic component is a laminated ceramic capacitor.

14. The electronic component series according to claim 10, wherein each of the electronic component holding portions includes a first inner peripheral wall perpendicular or substantially perpendicular to a lengthwise direction of the base material that defines a first angle with an upper surface of the base portion of the electronic component holding portion and a second inner peripheral wall perpendicular or substantially perpendicular to a width direction of the base material that defines a second angle with the upper surface of the base portion of the electronic component holding portion, and the first angle is greater than the second angle.

15. The electronic component series according to claim 10, wherein a bulge height of the electronic component holding portions bulging outward on the other surface of the base material is less than the thickness dimension of the base material.

* * * * *